United States Patent [19]
Cole

[11] Patent Number: 5,291,520
[45] Date of Patent: Mar. 1, 1994

[54] METHODS AND APPARATUS EMPLOYING DISTRIBUTION PRESERVING TOMLINSON PRECODING IN TRANSMISSION OF DIGITAL DATA SIGNALS

[75] Inventor: Paul D. Cole, Fairfield, Conn.

[73] Assignee: General DataComm, Inc., Middlebury, Conn.

[21] Appl. No.: 820,098

[22] Filed: Jan. 13, 1992

Related U.S. Application Data

[63] Continuation-in-part of Ser. No. 651,563, Feb. 6, 1991.

[51] Int. Cl.$^5$ ............................... H04B 1/10
[52] U.S. Cl. ........................ 375/34; 375/58; 375/60; 375/99
[58] Field of Search ........... 375/12, 14, 11, 58, 375/60, 34, 33, 7, 99; 371/43

[56] References Cited

U.S. PATENT DOCUMENTS 5,107,520  4/1992  Karam et al. ................. 375/60

OTHER PUBLICATIONS

"A simple and effective precoding scheme for noise whitening on intersymbol interference channels" by Rajiv Laroia et al. IEEE Jan. 2, 1992 pp. 1-6.

*Primary Examiner*—Curtis Kuntz
*Assistant Examiner*—T. Ghebretinsae
*Attorney, Agent, or Firm*—David P. Gordon

[57] ABSTRACT

A transmitter is provided with a distribution preserving Tomlinson coder which predistorts shaped data signals such that the power of each data signal exiting the coder is substantially similar to the power of the data signal entering the coder and such that upon transmission of the predistorted data signal over a channel, the effect of ISI of the channel is substantially removed. The transmitter is primarily intended for coded modulation systems utilizing a "coset" code, and the predistortion is preferably accomplished according to a linear function $$x_k + \sum_{l \geq 1} a_l x_{k-l} = r_k - s_k + \sum_{l \geq 1} b_l(r_{k-1} - s_{k-1})$$

where $r_k$ is a data signal entering the coder, $a_i$ and $b_i$ are the coefficients of polynomials relating to the channel impulse response, $x_k$ is the predistorted data signal exiting the coder, and $s_k$ is chosen to cause the signal power of $x_k$ on average to approximately equal the signal power of $r_k$ on average. Different methods for so choosing $s_k$ are disclosed. Receivers which cooperate with the provided transmitters are also provided.

20 Claims, 3 Drawing Sheets

METHODS AND APPARATUS EMPLOYING DISTRIBUTION PRESERVING TOMLINSON PRECODING IN TRANSMISSION OF DIGITAL DATA SIGNALS

This is a continuation-in-part of patent application Ser. No. 07/651,563 filed on Feb. 6, 1991 and assigned to the assignee hereof, which patent application is hereby incorporated by reference herein in its entirety.

BACKGROUND OF THE INVENTION

This invention generally relates to the transmission and receipt of data over telecommunications channels via the use of modems. More particularly, this invention relates to apparatus and methods for modem equalization which predistort data signals in a transmitter prior to sending the signals over a channel.

Data signals which are sent over a channel from a transmitter to a receiver are often corrupted by the inherent characteristics of the channel. Those inherent characteristics include the inability of a channel to provide a perfect response to a signal; i.e. the state of the channel at a previous moment in time affects the response of the channel at a later moment in time. In the art, this is known as intersymbol interference or ISI. In addition to ISI, data signals are also subjected to noise. Both the noise and ISI reduce the ability of a receiver to determine exactly what was transmitted from the transmitter.

In attempting to correct for ISI, it is common in the art to supply an equalizer in the receiver. The function of the equalizer is to correct for the ISI of the received signals so that the initial data can be recovered. With an equalizer in the receiver, typically, a known sequence of data signals (i.e. a training sequence) is sent from the transmitter to the receiver. Being that the data signal sequence itself is known, and the signals being received are known, it is possible for the equalizer first to determine the effects of the channel (i.e. the channel coefficients) on the transmitted signals, and then to compensate for those effects via any of several processes such as linear equalization or decision feedback equalization. Linear equalization functions by multiplying the incoming signals by the inverse of the ISI. While the ISI is generally removed from the incoming signals in this manner, noise inherent in the data transmission is undesirably simultaneously amplified. Additional details of linear equalization may be obtained by reference to Lee, Edward A. and Messerschmitt, David G., *Digital Communication;* (Kluwer Academic Publishers, 1988).

Decision feedback equalization avoids the noise amplification problems of linear equalization. However, in recreating the ISI via feedback, decision feedback equalization runs the risk of error propagation, as any decision errors that are made are fed back. Additional details of decision feedback equalization may be obtained by reference to Lee, Edward A. and Messerschmitt, David G., *Digital Communication;* (Kluwer Academic Publishers, 1988).

In response to the problems of linear and decision feedback equalization, M. Tomlinson, "New Automatic Equalizer Employing Modulo Arithmetic"; *Electronics Letters* Vol. 7, (March, 1971) pp. 138-139, suggested that equalization occur in the transmitter rather than in the receiver. In other words, the signals should be predistorted in the transmitter in such a manner that would cancel out the ISI of the channel upon transmission. As a result, after travel through the channel, the signals being received by the receiver would correspond to those signals which were generated by the transmitter prior to the predistortion, except for noise. The noise accompanying the data would not be amplified.

In more mathematical terms, if a series of data points $r_k$ are to be sent from the transmitter to the receiver, the Tomlinson scheme precodes the data according to a linear function:

$$x_k + \sum_{l \geq 1} h_l x_{k-1} = r_k \bmod M$$

where $x_k$ is the ISI corrected (i.e. predistorted) signal which is transmitted over the channel, $r_k$ is the precorrected selected signal point, and $h_l$ are the coefficients of a polynomial which describes the channel's impulse response (i.e. ISI).

While Tomlinson precoding is generally effective, the manner in which Tomlinson processes the signals prior to transmission causes signals having a desired power distribution which provides coding gain (e.g. as seen in U.S. Ser. Nos. 07/535,329 and 07/640,260 which are hereby incorporated by reference herein) to lose that gain. In other words, if the Tomlinson precoding is to be used, there is no benefit in providing a signal constellation having a desired "shape" or power distribution, as the Tomlinson precoding substantially destroys desired power distributions of coded signals. While for certain data transmission schemes this feature is acceptable, in high speed modems (e.g. 19.2 kbits/sec) it is advantageous that any gain available be maintained.

Recently, in Forney Jr., G. David, "Trellis Shaping", *IEEE Information Theory Workshop, CCITT Study Group XVII & Working Parties,* Geneva 15-23 Oct. 1990 (Temporary Document 211-E), an in Forney Jr., G. David, "Trellis Precoding: Combined Coding, Precoding and Shaping for Intersymbol Interference Channels", *IEEE Information Theory Workshop, CCITT Study Group XVII & Working Parties,* Geneva 15-23 Oct. 1990 (Temporary Document 212-E), Forney proposed an equalization scheme which avoids the drawbacks of both the equalization in the receiver, and the Tomlinson precoding methods. As set forth in the Forney articles, Trellis encoded and modulated data signals are predistorted to account for ISI in a manner which simultaneously provides minimum possible energy of the transmitted signal. While the Forney method theoretically provides excellent results, it has several drawbacks. First, the shaping scheme of Forney adds considerable delay to the process of transmitting data. Second, the Forney method requires very complex processing.

SUMMARY OF THE INVENTION

It is therefore an object of the invention to provide a transmitter which predistorts data signals having a desired power distribution without destroying the power distribution of the data signals.

It is another object of the invention to provide a transmitter which straight-forwardly predistorts coded data signals while substantially maintaining the power distribution of those coded data signals.

It is a further object of the invention to provide a transmitter which predistors coded data signals without introducing additional delay and which substantially maintains the power distribution of the coded data signals.

It is an additional object of the invention to provide a receiver having a decoder for decoding coded data signals which have been predistorted without destroying the power distribution of the coded data signals and which have been sent through a distorting channel.

It is yet a further object of the invention to provide a digital telecommunications system having a transmitter and receiver where predistorted shaped data signals are transmitted over a channel, and shaped data signals received by the receiver are decoded.

In accord with the objects of the invention, a transmitter is provided with precoding means which predistorts shaped data signals such that the power of each data signal exiting the precoding means is substantially similar to the power of the data signal entering the precoding means and such that upon transmission of the predistorted data signal over a channel, the effect of intersymbol interference of the channel is substantially removed. The transmitter of the invention is primarily intended for coded modulation systems utilizing a "coset" code, and the predistortion is preferably accomplished according to a linear function $$x_k + \sum_{l \geq 1} a_l x_{k-l} = r_k - s_k + \sum_{l \geq 1} b_l(r_{k-l} - s_{k-l}) \quad (1)$$

Where $r_k$ is a data signal entering the precoding means, $a_i$ and $b_i$ are the coefficients of polynomials relating to the channel impulse response, $x_k$ is the predistorted data signal exiting the precoding means, and $s_k$ is chosen to cause the signal power of $x_k$ on average to approximately equal the signal power of $r_k$ on average. Different manners of choosing $s_k$ to accomplish this are set forth. For example, $s_k$ may be chosen as a multiple of a given value (N) which is chosen to cause $x_k$ and $r_k$ to occupy identical defined regions in space, where the total length and/or width of each defined region is the given value N; or $s_k$ may be chosen to cause $x_k$ to approximate $r_k$ (i.e., s chosen closest to $$\sum_{l \geq 1} b_l(r_{k-l} - s_{k-l}) - \sum_{l \geq 1} a_l x_{k-l}\bigg).$$

In accord with another aspect of the $s_k$ may be chosen at the transmitter according to a second linear function:

$$X_k + \sum_{l \geq 1} u_l X_{k-l} = r_k - s_k + \sum_{l \geq 1} v_l(r_{k-l} - s_{k-l}) \quad (2)$$

where $r_k$ is a data signal entering the precoding means, $X_k$ an approximator of $x_k$, $u_i$ and $v_i$ are the coefficients of polynomials chosen such that $X_k$ is an approximator of $x$, and $s_k$ is chosen to cause the signal power of $X_k$ on average to approximately equal the signal power of $r_k$ on average. Typically, the coefficients u are set to zero. Where $s_k$ is chosen according to equation (2), it will be appreciated that upon sending a signal, predistortion itself is still accomplished according to equation (1). It should also be appreciated in using the approximation linear function (2) in choosing $s_k$, that $s_k$ may still be chosen as a multiple of a given value N chosen to cause $X_k$ and $r_k$ to occupy identical defined regions in space, or to cause $X_k$ to approximate $r_k$ (i.e., a chosen closest $$\sum_{l \geq 1} v_l(r_{k-l} - s_{k-l}) - \sum_{l \geq 1} u_l X_{k-l}\bigg).$$

Thus, four different combinations are set forth: choose $s_k$ as a multiple of a given value to cause $x_k$ and $r_k$ to occupy identical defined regions in space, where $s_k$ is chosen according to equation (1) and predistortion is accomplished according to equation (1) (this arrangement having been taught in the parent application hereto); choose $s_k$ as a multiple of a given value to cause approximator $X_k$ and $r_k$ to occupy identical defined regions in space, where s is chosen according to equation (2) and predistortion is accomplished according to equation (1); choose $s_k$ to cause $x_k$ to approximate $r_k$ and predistortion is accomplished according to equation (1); and choose $s_k$ to cause approximator X to approximate $r_k$ (as in equation (2)) and accomplish predistortion according to equation (1).

Further in accord with the objects of the invention, a receiver is provided with a decoder for decoding received data signals which have been predistorted as summarized above. The receiver receives a sequence of signals, and processes the sequence to provide a sequence of signals whose k'th term is an estimate of $r_k - s_k$. If in the transmitter, s was chosen to cause $x_k$ or $X_k$ and $r_k$ to occupy identical regions in space, then from the estimate of $r_k - s_k$, the decoder of the receiver preferably generates an estimate of $x_k$ or $X_k$ (depending upon how the coding was accomplished in the transmitter) by multiplying the received estimate by the ISI. From the estimate of $x_k$ or $X_k$, and the estimate of $r_k - s_k$, the decoder determines the particular value of an estimate of $s_k$, and hence the value of an estimate of $r_k$. On the other hand, if in the transmitter, $s_k$ was chosen to cause $x_k$ or $X_k$ to approximate $r_k$, then $s_k$ is taken as the closest point to an estimate of $$\sum_{l \geq 1} b_l(r_{k-l} - s_{k-l}) - \sum_{l \geq 1} a_l x_{k-l}\bigg)$$

or to an estimate of $$\sum_{l \geq 1} v_l(r_{k-l} - s_{k-l}) - \sum_{l \geq 1} u_l X_{k-l}\bigg).$$

The telecommunication system invention preferably utilizes the above-summarized transmitter and the above-summarized receiver. The methods of the invention relate closely to transmitter, receiver, and system apparatus inventions.

Additional objects and advantages of the invention will become apparent to those skilled in the art upon reference to the detailed description taken in conjunction with the provided drawings.

BRIEF DESCRIPTION OF THE DRAWINGS

FIG. 3 is a block diagram of a portion of the preferred receiver of the invention.

DETAILED DESCRIPTION OF THE PREFERRED EMBODIMENTS

Figure 1:
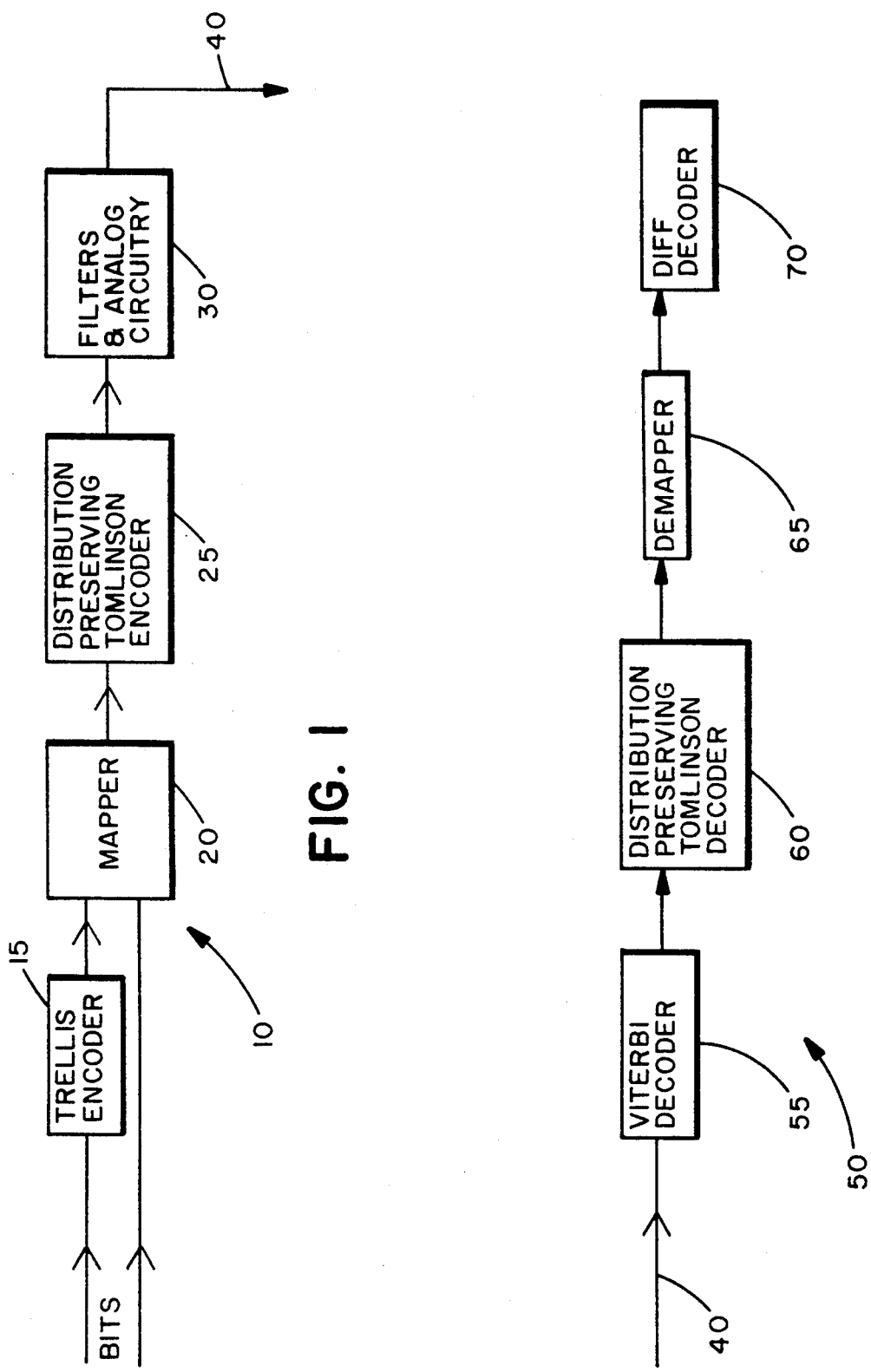
FIG. 1 is a block diagram of a portion of the transmitter of the invention.

A portion of a modem transmitter 10 is seen in FIG. 1. The preferred transmitter 10, as shown, includes a Trellis encoder 15, a mapper 20, a distribution preserving Tomlinson encoder 25, and filters and analog circuitry 30 for interfacing with a channel 40. Details of a Trellis encoder 15 may be found in Lee, Edward A. and Messerschmitt, David G., *Digital Communication;* (Kluwer Academic Publishers, 1988). The preferred mapper 20 of the invention is the mapper disclosed in U.S. Ser. Nos. 07/535,329 and 07/640,260 which were previously incorporated by reference herein. The mapper 20 preferably provides to the distribution preserving Tomlinson encoder 25 a series of data signals which are drawn from a "shaped" constellation; i.e. a series of data signals having a desired power distribution. The function of the distribution preserving Tomlinson encoder 25 is to predistort the data signals to account for channel ISI while simultaneously substantially maintaining the power distribution of the data signals being transmitted.

According to the invention, predistortion is accomplished in the distribution preserving Tomlinson encoder 25 according to a linear function (set forth above as equation 1):

$$x_k + \sum_{l \geq 1} a_l x_{k-1} = r_k - s_k + \sum_{l \geq 1} b_l(r_{k-1} - s_{k-1})$$

where $r_k$ is the data signal generated by mapper 20 and forwarded to the encoder 25, $a_i$ and $b_i$ are the coefficients of polynomials relating to the channel impulse response, $x_k$ is the predistorted data signal exiting the distribution preserving Tomlinson encoder 25, and $s_k$ is chosen to cause the signal power of $x_k$ on average to approximately equal the signal power of $r_k$ on average.

In accord with the invention, there are four different preferred manners of choosing $s_k$. A first manner is to choose $s_k$ as a multiple of a given value (N) which is chosen to cause $x_k$ and $r_k$ to occupy identical defined regions in space, where the total length and/or width of each defined region is the given value N. Details of this manner of choosing $s_k$ are set forth in the parent application hereto, Ser. No. 07/651,563, which was previously incorporated by reference herein. These details are not included herein for sake of brevity.

A second manner of choosing $s_k$ is substantially similar to the manner set forth in parent application Ser. No. 07/651,563 except that instead of choosing $s_k$ to cause $x_k$ and $r_k$ to occupy identical defined regions in space, $s_k$ is chosen to cause x to approximate $r_k$. In other words, using equation (1), $s_k$ is chosen as the $s_k$ value closest $$\sum_{l \geq 1} b_l(r_{k-1} - s_{k-1}) - \sum_{l \geq 1} a_l x_{k-1}$$

In order to break a tie, any tie-breaking scheme can be utilized, such as, e.g., using the $s_k$ which is closest to zero.

It will be appreciated that in choosing a set S of $s_k$'s which can be used to cause $x_k$ to approximate $r_k$, any number of $s_k$'s can be utilized, provided at least zero and at least one other value are included. In particular, the set of $r_k - s_k$'s is an enlargement of the set of $r_k$'s. The size of the enlargement of the set of $r_k - s_k$'s is dependent on the size of the set S. While a large number of $s_k$'s is beneficial for accuracy, it will be appreciated that a reduction in the number of $r_k - s_k$'s chosen can enhance the estimation procedures used in the receiver as well as providing simplicity in the receiver and transmitter.

A third manner of choosing $s_k$ is also substantially similar to the manner set forth in parent application Ser. No. 07/651,563, except that instead of using $s_k$ to cause $x_k$ and $r_k$ to occupy identical defined regions in space, $s_k$ is instead chosen to cause $X_k$ and $r_k$ to occupy identical defined regions in space, where X is an approximation of $x_k$ and is defined by a linear function as set forth in equation (2) above:

$$X_k + \sum_{l \geq 1} u_l X_{k-1} = r_k - s_k + \sum_{l \geq 1} v_l(r_{k-1} - s_{k-1})$$

where $r_x$ a data signal entering the precoding means, and $u_l$ and $v_l$ are the coefficients of polynomials chosen such that $X_k$ is an approximator of $x_k$. Once s is so chosen, predistortion is accomplished according to equation (1) set forth above. Effectively, then, in the third (and preferred) embodiment $s_k$ is chosen based on an approximation. The use of an approximation is advantageous because it includes, among others, the case where the $u_l$ coefficients are zero. When the $u_l$ coefficients are zero, feedback is eliminated in the decoding algorithm of the receiver.

In the third manner of choosing $s_k$, it will be appreciated that $s_k$ is a multiple of a given value (N) where the length and/or width of each defined region is the given value N. Where a one-dimensional system is utilized, $r_k$, $X_k$, and $s_k$ are preferably real numbers, and the regions of total length N in space occupied by $X_k$ and $r_k$ are along a line, while where a two-dimensional system is utilized, $r_k$, $X_k$ and $s_k$ are preferably complex numbers, and $X_k$ and $r_k$ are located within areas located within two-dimensional regions which are Cartesian products of the two one-dimensional regions.

The fourth manner of choosing $s_k$ is effectively a combination of aspects of the second and third manners; i.e., $s_k$ is chosen to cause the approximation $X_k$ to approximate $r_k$. In other words, in choosing $s_k$, the approximation of equation (2) is utilized, and instead of using $s_k$ to cause $X_k$ and $R_k$ to occupy identical defined regions in space, $s_k$ is chosen to cause X to be substantially equal to $r_k$; i.e., the $s_k$ is chosen as the $s_k$ value closest to $$\sum_{l \geq 1} v_l(r_{k-1} - s_{k-1}) - \sum_{l \geq 1} u_l X_{k-1}$$

Again, the $s_k$'s in the set S should include at least value zero and one other value, and can be limited based on the discussion above.

Figure 2:
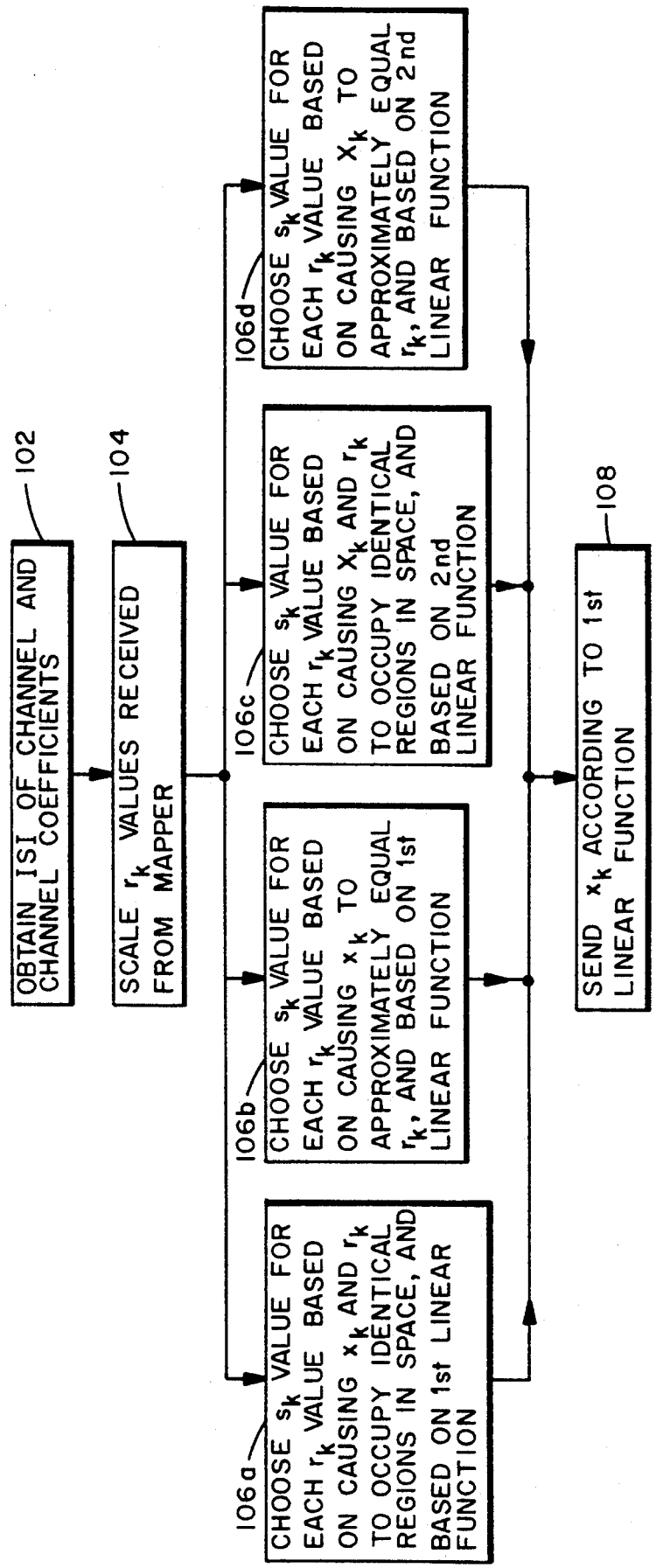
FIG. 2 is a flow chart of the method of the invention carried out in the distribution preserving Tomlinson encoder of FIG. 1.

More particularly, and as shown in FIG. 2, at step 102 the distribution preserving Tomlinson encoder 25 obtains the ISI of the channel 40 (e.g. from memory); the ISI having typically been determined initially by a receiver via the use of training sequence technology, and communicated back to the transmitter. As part of step 102, the channel coefficients $a_l$ and $b_l$ are obtained (e.g. from memory) such that $$\left(1 + \sum_{l \geq 1} a_l D^l\right) / \left(1 + \sum_{l \geq 1} b_l D^l\right)$$

approximates the channel impulse

Then, at step 104, the $r_k$ value from the mapper 20 (which is preferable obtained via the mapping technique described in U.S. Ser. Nos. 07/535,329 and 07/640,260 which were previously incorporated by reference herein) is preferably scaled such that the input of mapper 20 is a half-integer; e.g. . . . $-\frac{1}{2}, \frac{1}{2}, 3/2, 5/2$, etc., (although such scaling is not necessarily required). Then, a value for $s_k$ must be chosen to cause the signal power of $x_k$ on average to approximately equal the signal power of $r_k$ on average. The manner in which $s_k$ is chosen is according to any of the four previously described manners. Thus, as seen at 106a, $s_k$ is chosen for each r value based on causing $x_k$ and $r_k$ to occupy identical regions in space, and based on the first linear function. As seen at 106b, $s_k$ is chosen for each r value based on causing $x_k$ to approximately equal $r_k$, and based on the first linear function. As seen at 106c, $s_k$ is chosen for each $r_k$ value based on causing $X_k$ and $r_k$ to occupy identical regions in space, and based on the second linear function. As seen at 106d, $s_k$ is chosen for each r value based on causing $X_k$ to approximately equal $r_k$, and based on the second linear function. Regardless of how $s_k$ is chosen, at 108, x is sent according to the first linear function.

Where $s_k$ is chosen to cause x or $X_k$ and $r_k$ to occupy identical defined regions in space, the regions may be defined in manners set forth in parent application Ser. No. 07/651,563 or in other suitable manners. Also, for these situations, as described in the integers (i.e. they are multiples of 2). On the other hand, regardless of whether $s_k$ is chosen to cause x or $X_k$ and $r_k$ to occupy identical defined regions in space or is chosen to cause $x_k$ or $X_k$ to be approximately equal to $r_k$, in order to accommodate coding/decoding, the only restriction on the coding of the input sequence $\{r_k\}$ is that the hereinafter described receiver must recognize $\{r_k - s_k\}$ as a valid coded sequence whenever $\{r\}$ is a coded sequence of $r_k$'s, and $\{r_k - s_k\}$ is a corresponding sequence of $r_k - s_k$'s. Further, in order to accommodate differential encoding/decoding, of $\{x_k\}$ is the output sequence generated by the input sequence $\{r_k\}$, then $\{-x_k\}$ should be the output sequence generated by the input sequence $\{-r_k\}$.

While the mathematics set forth above deals in only one dimension, the extension to two dimensions is straight-forward. In two dimensions, the sequence $\{r_k\}$ is a sequence of complex numbers having real and imaginary portions: Re($r_k$ and Im(r). In fact, extension to more than two dimensions will suggest itself to those skilled in the art.

Turning to FIG. 3, a block diagram of the receiver 50 of the invention is seen. The preferred receiver includes a Viterbi decoder 55, a distribution preserving Tomlinson decoder 60, a demapper 65, and in some embodiments a differential decoder 70. The function of the Viterbi decoder 55 is to receive the signals sent over channel 40, and to decode the Trellis coding so as to provide an estimate of $r_k - s_k$; i.e. $\widetilde{r_k - s_k}$, to the distribution preserving Tomlinson decoder. From $\widetilde{r_k - s_k}$, the distribution preserving Tomlinson decoder 60 of the invention finds values for the series of $\tilde{r}_k$, which are estimates of $r_k$, as set forth in more detail with reference to FIG. 4. The $\tilde{r}_k$ values are then sent to the demapper 65 which provides to the differential decoder 70 a series of points drawn from a constellation.

Figure 4:
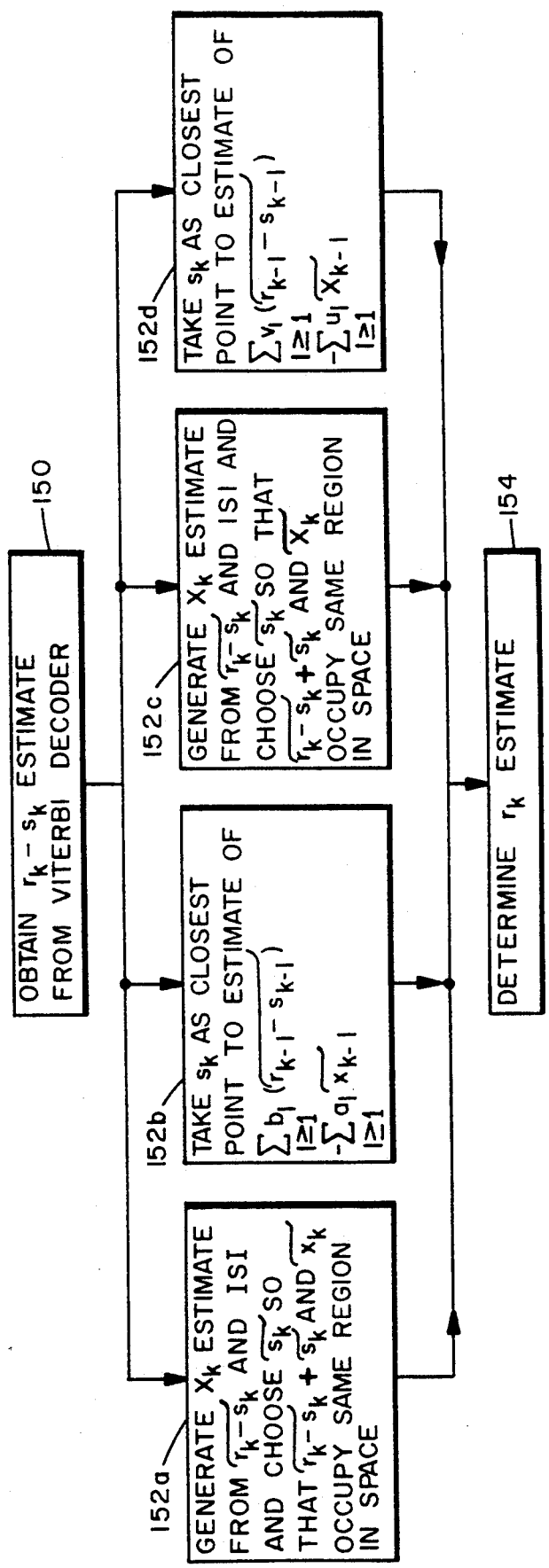
FIG. 4 is a flow chart of the method of the invention carried out in the distribution preserving Tomlinson decoder of FIG. 3.

Details of the manner in which the distribution preserving Tomlinson decoder 60 determines $\tilde{r}_k$ are seen with reference to FIG. 4. At step 150, the decoder 60 receives $\widetilde{r_k - s_k}$ from the Viterbi decoder 55 Then, if in the transmitter, $s_k$ was chosen to cause $x_k$ and $r_k$ to occupy identical regions in space, then at 152a from the estimate of $r_k - s_k$, the decoder of the receiver preferably generates an estimate of $x_k$ ($\tilde{x}_k$) by multiplying the received estimate by the ISI; i.e., $$\tilde{x}_k + \sum_{l \geq 1} a_l \tilde{x}_{k-1} = \widetilde{r_k - s_k} + \sum_{l \geq 1} b_l (\widetilde{r_{k-1} - s_{k-1}})$$

Then $\tilde{s}_k$ is chosen so that $\widetilde{r_k - s_k} + \tilde{s}_k$ and $\tilde{x}_k$ occupy the same region in space. If, in the transmitter, $s_k$ was chosen to cause $x_k$ to approximately equal $r_k$, then at 152b, $\tilde{s}_k$ is taken as the closest point to $$\left(\sum_{l \geq 1} b_l(\widetilde{r_{k-1} - s_{k-1}}) - \sum_{l \geq 1} a_l \tilde{x}_{k-1}\right).$$

Where the $a_l$ coefficients are taken as zero, no $\tilde{x}_{k-i}$ values need be generated.

However, where one or more of the $a_l$ coefficient are not zero, the $\tilde{x}_{k-1}$ values are the previous estimates $\tilde{x}_k$ generated as above. If, in the transmitter $s_k$ was chosen to cause $X_k$ and $r_k$ to occupy identical regions in space, then from the estimate of $r_k - s_k$, then at 152c the decoder of the receiver preferably generates an estimate $\tilde{X}_k$ by multiplying the received estimate by the ISI; i.e., $$\tilde{X}_k + \sum_{l \geq 1} u_l \tilde{X}_{k-1} = \widetilde{r_k - s_k} + \sum_{l \geq 1} V_l(\widetilde{r_{k-1} - s_{k-1}})$$

Then $\tilde{s}_k$ is chosen so that $\widetilde{r_k - s_k} + \tilde{s}_k$ and $\tilde{X}_k$ occupy the same region in space. Finally, if, in the transmitter, the $s_k$ was chosen to cause $X_k$ to approximately equal $r_k$, then at 152d, $\tilde{s}_k$ is taken as the closest point to $$\left(\sum_{l \geq 1} v_l(\widetilde{r_{k-1} - s_{k-1}}) - \sum_{l \geq 1} u_l \tilde{X}_{k-1}\right).$$

Again, if the $u_l$ coefficients are not zero, the $\tilde{x}_{k-1}$ values are previous $\tilde{X}_k$ as generated above. Regardless of the manner in which $\tilde{s}_k$ is derived, at step 154, from the estimate of $s_k$, the decoder 60 determines $\tilde{r}_k$ according to $$\tilde{r}_k = \widetilde{r_k - s_k} + \tilde{s}_k \qquad (3)$$

While the above disclosure regarding the receiver of the invention deals in only one dimension, the extension to two dimensions is straight-forward. For example, in two dimensions, the sequence $\{r_k - s_k\}$ is a sequence of complex numbers having real and imaginary portions: Re($r_k - s_k$) and Im($r_k - s_k$). As with the transmitter, in the receiver, the real and imaginary portions are treated separately, but each is treated exactly as set forth above Again, extension to more than two dimensions will suggest itself to those skilled in the art.

The telecommunication system invention preferably utilizes the transmitter and the receiver invention previously described. It will be appreciated that where a particular embodiment of the transmitter is utilized, a corresponding embodiment of the receiver should be utilized for compatibility.

There have been described and illustrated herein transmitter provided with (pre)coding means which predistorts shaped data signals such that the power of each data signal exiting the precoding means is substantially similar to the power of the data signal entering the precoding means and such that upon transmission of the predistorted data signal over a channel, the effect of intersymbol interference of the channel is substantially removed. Also described and illustrated herein are receivers which cooperate with such transmitters. While particular embodiments have been described, it will be appreciated that it i not intended that the invention be limited thereby, as it is intended that the invention be as broad in scope as the art will allow. Thus, while the transmitters of the invention were described as preferably having Trellis encoders, and the receivers of the invention were described as preferably having Viterbi decoders, it will be appreciated that the invention has application to transmitters and receivers employing different types of coding, or no coding at all. Also, while the invention suggested use of certain mappers providing coding gain, it will be appreciated that other mappers could be utilized. Of course, it will be appreciated that the precoding and decoding are carried out using standard apparatus such as properly programmed DSPs, microprocessors or other processors.

Those skilled in the art will also appreciate that while the invention was set forth in detail for one dimensional signals, and for two dimensional signals based on a rectangular grid, the concepts of the invention also apply to two dimensional signals based on other grids (e.g. hexagonal) as well as to signals having three or more dimensions. In fact, even though the disclosed implementation of the invention has deficiencies when one or more of the coefficients $u_i$ are not zero, those skilled in the art will appreciate that various techniques can be utilized to overcome those deficiencies. Therefore, it will be apparent to those skilled in the art that yet other changes and modifications may be made to the invention as described without departing from the scope and spirit of the invention is so claimed.

I claim:

1. A transmitter for transmitting a series of telecommunications signals over a telecommunications channel, said transmitter comprising:

coding means for predistorting first telecommunications signals according to a linear function $$x_k + \sum_{l \geq 1} a_l x_{k-1} = r_k - s_k + \sum_{l \geq 1} b_l(r_{k-1} - s_{k-1})$$

to provide predistorted output second telecommunication signals, wherein $r_k$ represents a first telecommunication signal which is to be predistorted by said coding means, $a_i$ and $b_i$ respectively represent coefficients of first and second polynomials relating to the channel impulse response of said telecommunications channel, $x_k$ represents a predistorted output second telecommunications signal, and $s_k$ is chosen to cause the signal power of $x_k$ on average to approximately equal the signal power of $r_k$ on average; and interface means coupled to said coding means, said interface means for receiving said predistorted output second telecommunications signals and for processing said predistorted output second telecommunications signals for transmission on said telecommunications channel.

2. A transmitter according to claim 1, wherein: $s_k$ is chosen to cause $x_k$ to be approximately equal to $r_k$.

3. A transmitter according to claim 1, wherein: $s_k$ is chosen according to a second linear function $$X_k + \sum_{l \geq 1} u_l X_{k-1} = r_k - s_k + \sum_{l \geq 1} v_l(r_{k-1} - s_{k-1})$$

where $X_k$ an approximator of $x_k$, and $u_i$ and $v_i$ respectively represent coefficients of first and second polynomials chosen to cause $X_k$ to approximate $x_k$, and $s_k$ is a multiple of a given value (N) which is chosen by said coding means to cause $X_k$ and $r_k$ to occupy identical defined regions in space, where the total length and/or width of each defined region is the given value N.

4. A transmitter according to claim 1, wherein: $s_k$ is chosen according to a second linear function $$X_k + \sum_{l \geq 1} u_l X_{k-1} = r_k - s_k + \sum_{l \geq 1} v_l(r_{k-1} - s_{k-1})$$

where $X_k$ an approximator of $x_k$, and $u_i$ and $v_i$ respectively represent coefficients of first and second polynomials chosen to cause $X_k$ to approximate $x_k$, and $s_k$ is chosen to cause $X_k$ to be approximately equal to $r_k$.

5. A transmitter according to claim 3, wherein $r_k$, $X_k$ and $s_k$ are complex numbers having real and imaginary portions, and $X_k$ and $r_k$ are located within identical two-dimensional regions which are Cartesian products of a defined real and a defined imaginary one-dimensional region, each of total length N.

6. A transmitter according to claim 1, wherein: said real portion of $s_k$ and said imaginary portion of $s_k$ are even integers, and real portion of $r_k$ and said imaginary portion of $r_k$ are scaled data signals.

7. A receiver for receiving a series of signals over a channel, where the signals were first predistorted according to a linear function $$x_k + \sum_{l \geq 1} a_l x_{k-1} = r_k - s_k + \sum_{l \geq 1} b_l(r_{k-1} - s_{k-1})$$

and then subjected to ISI of said channel and noise, wherein $r_k$ represents a signal which is to be predistorted according to said linear function, $a_i$ and $b_i$ respectively represent coefficients of first and second polynomials relating to said channel ISI, $x_k$ represents a signal which is subjected to said ISI, and $s_k$ is chosen to cause the signal power of $x_k$ on average to approximately equal the signal power of $r_k$ on average, said receiver comprising:

a) means for receiving said series of signals and generating from a k'th signal of said series of signals an estimate of $r_k-s_k$; and
b) decoder means for generating from said estimate of $r_k-s_k$ and/or an indication of said ISI an estimate of $s_k$, and from said estimate of $r_k-s_k$ and said estimate of $s_k$ an estimate of $r_k$.

8. A receiver according to claim 7, wherein:
said estimate of $s_k$ is generated by causing said estimate of $s_k$ to be an $s_k$ value which is closest to $$\sum_{l \geq 1} b_l(\widetilde{r_{k-1} - s_{k-1}}) - \sum_{l \geq 1} a_l x_{k-1}$$

where $\tilde{x}_{k-i}$ are estimates of previous $x_k$.

9. A receiver according to claim 8, wherein:
said coefficients $s_i$ are chosen as zero.

10. A receiver according to claim 8, wherein:
$x_{k-i}$ are previous $x_k$ estimates ($\tilde{x}_k$), where $\tilde{x}_k$ is determined by multiplying said estimate of $r_k-s_k$ by said ISI according to $$\tilde{x}_k + \sum_{l \geq 1} a_l \tilde{x}_{k-1} = \widetilde{r_k - s_k} + \sum_{l \geq 1} b_l(\widetilde{r_{k-1} - s_{k-1}})$$

where $\widetilde{r_k - s_k}$ is said estimate of $r_k - s_k$.

11. A receiver according to claim 10, wherein:
said estimate of $s_k$ is generated by causing said estimate of $r_k - s_k$ plus said estimate of $s_k$ to occupy an identical one of a plurality of defined regions in space as $\tilde{X}_k$, where $\tilde{X}_k$ is an estimnate of $X_k$, and $X_k$ is an approximator of $x_k$.

12. A receiver according to claim 11, wherein:
$\tilde{X}_k$ is determined by multiplying said estimate of $r_k-s_k$ by said ISI according to $$\tilde{X}_k + \sum_{l \geq 1} u_l \tilde{X}_{k-1} = r_k - s_k + \sum_{l \geq 1} v_l(r_{k-1} - s_{k-1})$$

where $u_i$ and $v_i$ are respectively coefficients of first and second polynomials chosen to cause $X_i$ to estimate $x_k$.

13. A receiver according to claim 7, wherein:
said estimate of $s_k$ is generated by causing said estimate of $s_k$ to be an $s_k$ value which is closest to $$\sum_{l \geq 1} v_l(r_{k-1} - s_{k-1}) - \sum_{l \geq 1} u_l X_{k-1}$$

where $\tilde{X}_{k-1}$ are previous estimates of $X_k$ ($\tilde{X}_k$), $X_k$ is an approximator of $x_k$, and $u_i$ and $v_i$ are respectively coefficients of first and second polynomials chosen to cause $X_k$ to estimate $x_k$.

14. A receiver according to claim 13, wherein:
said coefficients $u_i$ are chosen as zero.

15. A receiver according to claim 13, wherein:
$\tilde{X}_k$ is determined by multiplying said estimate of $r_x-s_k$ by an approximation of said ISI according to $$\tilde{X}_k + \sum_{l \geq 1} u_l \tilde{X}_{k-1} = \widetilde{r_k - s_k} + \sum_{l \geq 1} v_l(\widetilde{r_{k-1} - s_{k-1}})$$

where $\widetilde{r_k-s_k}$ is said estimate of $r_k-s_k$.

16. A telecommunications system, comprising:
a) a telecommunications channel;
b) a transmitter for transmitting a series of data signals over said channel, said transmitter including coding means for predistorting data signals according to a linear function $$x_k + \sum_{l \geq 1} a_l x_{k-1} = r_k - s_k + \sum_{l \geq 1} b_l(r_{k-1} - s_{k-1})$$

to provide predistorted output data signals, wherein $r_k$ represents a data signal which is to be predistorted by said coding means, $a_l$ and $b_i$ respectively represent coefficients of first and second polynomials relating to the channel impulse response of said channel, $x_k$ represents a predistorted output data signal, and $s_k$ is chosen to cause the signal power of $x_k$ on average to approximately equal the signal power of $r_k$ on average; and c) a receiver means for receiving a series of signals corresponding to said predistorted output data signals, said series of signals being said predistorted output data signals which were subjected to ISI of said channel and noise, said receiver means including means for generating from a k'th signal of said series of signals an estimate of $r_k-s_k$, and decoder means for generating from said estimate of $r_k-s_k$ and or from an indication of said ISI an estimate of $s_k$, and for determining from said estimate of $s_k$ and said estimate of $r_k-s_k$ an estimate of $r_k$.

17. A method for predistorting telecommunications signals in a coding means of a transmitter prior to transmission over a telecommunications channel, said method comprising:
a) obtaining telecommunications signals $r_k$ which are to be predistorted; and
b) predistorting said data signals $r_k$ according to a linear function $$x_k + \sum_{l \geq 1} a_l x_{k-1} = r_k - s_k + \sum_{l \geq 1} b_l(r_{k-1} - s_{k-1})$$

to provide predistorted output telecommunications signals $x_k$, wherein $a_i$ and $b_i$ respectively represent coefficients of first and second polynomials relating to the channel impulse response of said telecommunications channel, and $s_k$ is chosen to cause the signal power of $x_k$ on average to approximately equal the signal power of $r_k$ on average.

18. A method according to claim 17, wherein:
$s_k$ is chosen to cause $x_k$ to be approximately equal to $r_k$.

19. A method according to claim 18, wherein:
$s_k$ is chosen according to a second linear function $$X_k + \sum_{l \geq 1} u_l X_{k-1} = r_k - s_k + \sum_{l \geq 1} v_l(r_{k-1} - s_{k-1})$$

where $X_k$ an approximator of $x_x$, and $u_i$ and $v_i$ respectively represent coefficients of first and second polynomials chosen to cause $X_k$ to approximate $x_k$, and
$s_k$ is a multiple of a given value (N) which is chosen by said coding means to cause $X_k$ and $r_k$ to occupy identical defined regions in space, where the total length and/or width of each defined region is the given value N.

20. A method according to claim 17, wherein:
$s_k$ is chosen according to a second linear function $$X_k + \sum_{l \geq 1} u_l X_{k-1} = r_k - s_k + \sum_{l \geq 1} v_l(r_{k-1} - s_{k-1})$$

where $X_k$ an approximator of $x_k$, and $u_i$ and $v_i$ respectively represent coefficients of first and second polynomials chosen to cause $X_k$ to approximate $x_k$, and $s_k$ is chosen to cause $X_k$ to be approximately equal to $r_k$.

* * * * *

UNITED STATES PATENT AND TRADEMARK OFFICE
CERTIFICATE OF CORRECTION

PATENT NO. : 5,291,520
DATED : March 1, 1994
INVENTOR(S) : Paul D. Cole

It is certified that error appears in the above-identified patent and that said Letters Patent is hereby corrected as shown below:

Column 9, claim 1, line 6

$$x_k + \sum_{l \geq 1} a_l x_{k-1} = r_k - s_k + \sum_{l \geq 1} b_l (r_{k-1} - s_{k-1})$$

Signed and Sealed this

Thirtieth Day of January, 1996

Attest:

BRUCE LEHMAN

Attesting Officer     Commissioner of Patents and Trademarks